United States Patent
Sun et al.

(10) Patent No.: US 10,433,415 B2
(45) Date of Patent: Oct. 1, 2019

(54) COMPONENT CARRIER COMPRISING A COPPER FILLED MECHANICAL DRILLED MULTIPLE-DIAMETER BORE

(71) Applicant: AT&S (China) Co. Ltd., Minhang District, Shanghai (CN)

(72) Inventors: Sally Sun, SiJing (CN); Yee-Bing Ling, Kuching (MY); Nikolaus Bauer-Öppinger, Gramastetten (AT); Wilhelm Tamm, Salem (DE)

(73) Assignee: AT&S (China) Co. Ltd., Shanghai (CN)

( * ) Notice: Subject to any disclaimer, the term of this patent is extended or adjusted under 35 U.S.C. 154(b) by 0 days.

(21) Appl. No.: 15/418,692

(22) Filed: Jan. 28, 2017

(65) Prior Publication Data

US 2017/0223819 A1  Aug. 3, 2017

(30) Foreign Application Priority Data

Jan. 29, 2016 (CN) ..................... 2016 2 0096855 U

(51) Int. Cl.
| | |
|---|---|
| H05K 1/02 | (2006.01) |
| H05K 1/11 | (2006.01) |
| H05K 3/00 | (2006.01) |
| H05K 3/42 | (2006.01) |

(52) U.S. Cl.
CPC ......... *H05K 1/0206* (2013.01); *H05K 1/0296* (2013.01); *H05K 1/115* (2013.01); *H05K 3/0047* (2013.01); *H05K 3/42* (2013.01); *H05K 3/429* (2013.01); *H05K 2201/09563* (2013.01); *H05K 2201/09854* (2013.01)

(58) Field of Classification Search
CPC ........ H05K 1/02; H05K 1/0266; H05K 1/115; H05K 3/42
USPC ........................................... 361/719
See application file for complete search history.

(56) References Cited

U.S. PATENT DOCUMENTS

| | | | |
|---|---|---|---|
| 3,243,498 A | 3/1966 | Allen et al. | |
| 4,303,910 A * | 12/1981 | McCann | G08B 13/2422 340/572.2 |
| 5,406,034 A | 4/1995 | Frei et al. | |
| 8,242,379 B2 * | 8/2012 | Ikeda | H01L 21/4857 174/261 |
| 2006/0083895 A1 * | 4/2006 | Ikeda | B32B 3/10 428/137 |
| 2008/0060837 A1 * | 3/2008 | Matsui | H05K 1/115 174/261 |

(Continued)

FOREIGN PATENT DOCUMENTS

| | | |
|---|---|---|
| CN | 102781177 A | 11/2012 |
| JP | 08-125343 A | 5/1996 |

(Continued)

*Primary Examiner* — Mandeep S Buttar
(74) *Attorney, Agent, or Firm* — Robert A. Blaha; Smith Tempel Blaha LLC

(57) ABSTRACT

A component carrier includes a layer stack formed of an electrically insulating structure and an electrically conductive structure with a bore extending into the layer stack. The bore includes a first bore section with a first diameter and a connected second bore section with a second diameter differing from the first diameter. The component carrier further comprises a thermally conductive material filling substantially the entire bore. The bore is in particular formed by mechanical drilling.

12 Claims, 1 Drawing Sheet

(56) References Cited

U.S. PATENT DOCUMENTS

| | | | |
|---|---|---|---|
| 2010/0085717 A1* | 4/2010 | Sweeney | H05K 3/3447 361/761 |
| 2010/0307809 A1* | 12/2010 | Noda | H05K 1/115 174/266 |
| 2013/0025120 A1* | 1/2013 | Hondo | H05K 3/0014 29/849 |
| 2013/0146349 A1* | 6/2013 | Lee | H05K 1/115 174/262 |
| 2013/0213705 A1 | 8/2013 | Suehiro et al. | |

FOREIGN PATENT DOCUMENTS

| | | |
|---|---|---|
| JP | 08-153971 A | 6/1996 |
| WO | WO 03/049511 A1 | 6/2003 |

\* cited by examiner

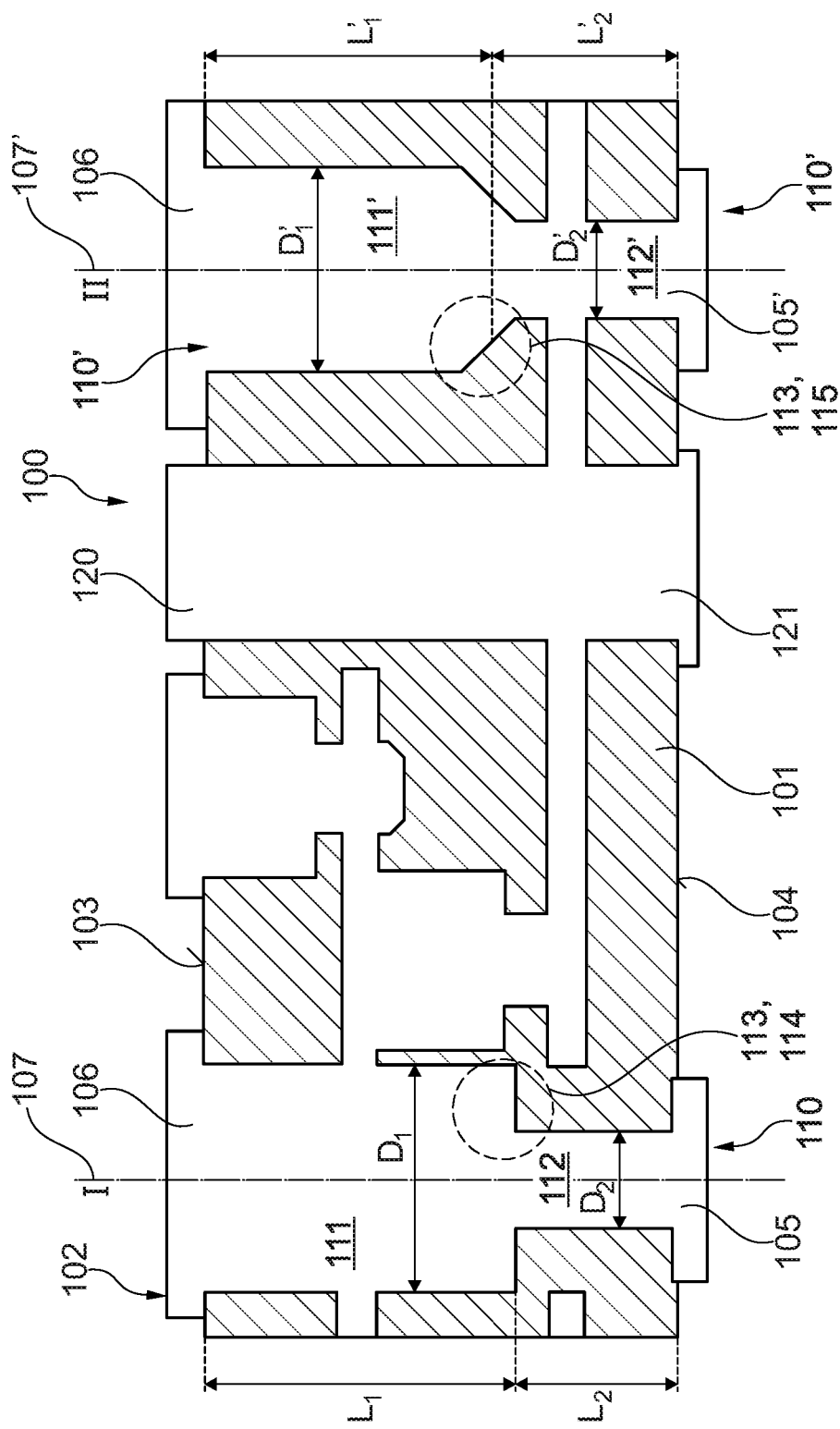

US 10,433,415 B2

COMPONENT CARRIER COMPRISING A COPPER FILLED MECHANICAL DRILLED MULTIPLE-DIAMETER BORE

This application claims the benefit of the filing date of Chinese Utility Model Application No. 201620096855.3 filed Jan. 29, 2016, the disclosure of which is hereby incorporated herein by reference.

TECHNICAL FIELD

The invention relates to a component carrier and to an electronic device. Furthermore, the invention relates to a method of manufacturing a component carrier.

TECHNOLOGICAL BACKGROUND

Conventionally, printed circuit boards (PCB) functioning as component carriers comprise a plurality of bores which form vias for generating an electrical connection to an electrical component. Additional, the bores are used to provide a heat transfer to the environment in order to reduce the risk of overheating. Around 30% of bores (vias) which may be formed by laser drilling are used only for heat transfer. Also there is a method using mechanically drilled holes for forming PTH (plated through hole) by using a resin-plug in to fill up the empty space.

Each component carrier usually comprises a plurality of vias (bores), for example more than thousand. Hence, it is necessary to provide a high-speed bore forming process in order to manufacture the component carrier in a short manufacturing time. Moreover, very small manufacturing tolerances for the size of the bores are allowed in order to provide a proper connectivity. Hence, the high-speed drilling process must not be only fast but must be also very accurate.

Conventional bores need to have a small diameter such that connection pads are kept small and the bores have enough space in the component carrier. However, small sized bores also have less capacity for the heat transfer.

SUMMARY

There may be a need to provide a component carrier with improved heat transfer capability compared to conventional approaches, especially for a component carrier with a high amount of vias.

According to a first aspect of the present invention, a component carrier is presented. The component carrier comprises a layer stack formed of an electrically insulating structure and an electrically conductive structure. Furthermore, the component carrier comprises a bore extending into the layer stack and having a first bore section with a first diameter and a connected second bore section with a second diameter differing from the first diameter. The component carrier further comprises a thermally conductive material filling substantially the entire bore. The bore may be in particular formed by mechanical drilling.

In the context of the present application, the term "component carrier" may particularly denote any support structure which is capable of accommodating one or more electronic components thereon and/or therein for providing both mechanical support and electrical connectivity. Exemplary embodiments of the component carrier are described further below.

Overview of the Component Carrier

Furthermore, the bore of the component carrier comprises the first bore hole section with the first diameter and the second bore hole section with the second diameter. The first diameter and the second diameter differ from each other. In an exemplary embodiment, the first bore hole diameter is larger than the second bore hole diameter. For example, the first diameter may denote the opening diameter of the first bore section at the first surface and the second diameter may denote the opening diameter of the second bore section at the second surface.

The bore is filled with the thermally conductive material. Besides the proper thermal conduction properties, the thermally conductive material may also be electrically conducting. In an exemplary embodiment, the thermally conductive material is copper or a copper compound.

For example, a multiple-diameter mechanical drilling (e.g. by a drill bit having two different diameter sections to form the bore in a counter bore or counter sink shape) may be used to replace the standard single diameter drill bit or stacked laser drilling process.

The bore filled with the thermally conductive material may form a via as connection between two or more layers within the layer stack of the component carrier (e.g. a Printed Circuit Board). The via may form a through hole, a blind via or a buried via.

By providing the bore with different diameter according to the present invention, a small diameter target pad size of a pad section made of the thermally conductive material and formed at an exit section of the bore and additionally a better heat transfer by the thermally conductive material within the larger (second) bore section of the bore is achieved.

According to a further exemplary embodiment, the layer stack comprises a first surface and a second surface opposing the first surface, wherein the bore extends between the first surface and the second surface.

According to a further exemplary embodiment, the first bore section extends from the first surface into the layer stack and the second bore section extends from the second surface into the layer stack.

According to a further exemplary embodiment, the thermally conductive material forms a pad section onto the second surface. The pad section may be connected e.g. to a printed circuit board track or the like. Furthermore, the pad section is part of the thermally conductive material which fills the bore so that a via (vertical connection) through the layer stack is formed. The via connects other embedded components and electrically layer structures within the layer stack to the pad. Typically, the pad has a larger diameter than the printed circuit board track.

However, it is possible to form the printed circuit board track and to fill the bore with the thermally conductive material in one single operating step. Hence, the pad section has the same size (width) as the printed circuit board track. Hence, a pad-free connection between the printed circuit board track and the via is possible, because no production tolerances are necessary. Hence, a pad-free and so called "landless" (joint free) via-printed circuit board track connection may be provided.

According to a further exemplary embodiment, the thermally conductive material extends along the first surface for forming a heat radiation section. The larger the heat radiation section along the first surface, the larger the heat that may be transported away from the component carrier.

According to a further exemplary embodiment, the heat radiation section forms a first covering area onto the first surface and the pad forms a second covering area onto the second surface. The first covering area is larger than the second covering area.

It is an aim to have smaller pad sections along the second surface so that a plurality of pad sections and hence a plurality of bores can be formed in the component carrier. The more pad sections are formed within the component carrier, the more connection possibilities of the component carrier are given. Hence, the pad sections should be small so that an undesired contact with adjacent pad section is prevented. On the other side, a large heat radiation section along the first surface is desired so that a proper heat transport away from the component carrier is provided. For example, fewer but larger bores used for heat transfer are formable but still allowing small capture pad sections with a small diameter.

Regarding the size of the heat radiation section, the overhang of the heat radiation section which is defined between a circumference of the heat radiation section and an edge of the first bore section at the first surface is limited in size, because if the overhang exceeds a certain threshold size, the risk of voids, cracks and other plating defects during a plating proceeding, where the thermally conductive material flows into the bores, increases.

The threshold size may be given in an aspect ratio AR which is defined by the thickness (length) A of a bore hole with respect to an opening diameter R of the bore at a respective surface of the component carrier:

$$AR=A/R$$

The plating capability can be improved by a reduction of aspect ratio AR. Hence, the aspect ratio AR can be reduced by decreasing the length of the bore and/or by increasing the opening diameter R.

Hence, by the above described bore comprising the first bore section having e.g. a larger diameter than the second bore section, the opening diameter R of the first bore section is increased in order to provide a large surface area of the heat radiation section, wherein the diameter R of the second bore section is reduced in order to provide a small sized pad section along the second surface.

Furthermore, the first length of the first bore section may be formed larger than the second length of the second bore section in order to provide a proper aspect ratio for both, the first bore section and the second bore section. For example, the first length may have the double length of the second length.

For example, in a conventional bore having a uniform diameter, a stack layer of a component carrier has a thickness A of 1 mm with 0.1 mm opening diameter R (also called mechanical drilled PTH (plated through hole) will have an aspect ratio AR=A/R of 10:1=10.

By dual diameter bore according to the present invention, the second bore section may have a second thickness A=⅓ of the board thickness (0.3 mm) and a second opening diameter R with 0.1 mm and the first bore section may have a first thickness ⅔ of the board thickness (=0.6 mm) formed with a first opening diameter of R=0.2 mm. Hence, the aspect ratio will be reduced to AR=3.33. The new aspect ratio lowers the risk for inclusion and other reliability defects during plating as the difficulty of the solution exchange inside the PTH is reduced. The same time, a smaller pad section by the second bore section is formed.

As can be taken from the exemplary above, the bore according to the present invention comprises a first aspect ratio of the first bore section and the second aspect ratio of the second bore section. Hence, the sum of both aspect ratios is smaller than the overall aspect ratio of conventional uniform bores.

Summarizing, the overall aspect ratio of the bore is reduced to ease a (copper) plating process. Furthermore, a smaller pad section of the second bore section is formed and the internal stress of the component carrier is reduced towards the thicker diameter/first section, and the reliability is improved. Furthermore, it may be in general advantageous to keep the impedance within the component carrier constant. However, constant impedance between conductive parts or lines and vias of the component carrier is difficult. By a smaller diameter (e.g. by the smaller second bore section comprising the second opening diameter), the capacity will be reduced and also the land and pad-size, respectively, may be reduced. As described above, also a "landless" via may be formed. A smaller land or a landless via affects also the capacity and the impedance, respectively. By the interaction of the diameter of the via and the land (pad size), the impedance may be regulated and adjusted, respectively, such that an impedance difference between a conductive line and a via may be compensated. A further advantage may be the reduction of loss. Because the diameter may be reduced, the capacity is reduced as well and thus charging currents are reduced.

Specifically, by the use of mechanical drilling, fewer, but larger bores used for heat transfer (but still hitting small capture pads with small top of drill bit) can be formed. It may be no longer necessary to provide bores only for heat transfer purposes.

For example a dual diameter counter bore drill bit can be used. Such a drill bit comprises a first drill portion with a first diameter and the second drill portion with a differing secondary diameter. Hence, differently sized first and second bore sections can be formed in one operating (drilling) step, i.e. under one continuous forward motion of the drill device along a drilling direction. Hence, a second drilling step is no longer necessary, so that the overall forming and manufacturing time of the respective bore holes is reduced.

Alternatively two drilling steps with standard uniform drill bit are necessary to generate the differently sized bore sections.

Summarizing, by the differently sized bore sections, a high aspect ratio limitation for the copper filling process is reduced and a tight/small target pad annular ring breakout is prevented. Furthermore, the total volume of copper (functioning as the thermally conductive material) in the filled via (bore) for better heat transfer is increased. Hence, less heat remains in the via which causes lower temperature and less expansion of the layer stack. This results in less stress and a better reliability of the component carrier.

According to a further exemplary embodiment the component carrier further comprises a further bore extending into the layer stack. The further bore is spaced apart from the bore, wherein the further bore extends between the first surface and the second surface. The thermally conductive material is filling substantially the entire further bore. The further bore may be formed with a uniform diameter or may be formed according to the bore with different diameter sections as described above.

According to a further exemplary embodiment the thermally conductive material extends along the first surface between the bore and the further bore. Hence, along the first surface, a common heat radiation section for the bore and the further bore may be generated. However, the heat radiation section of the bore may be electrically isolated with respect to the further heat radiation section of the further bore.

According to a further exemplary embodiment, between the first bore section and the second bore section a transition section is formed. In the transition section the first diameter merges into the second diameter.

According to a further exemplary embodiment, the transition section has a step-like shape (so that the first diameter merges into the second diameter in a stepwise and abrupt manner). The step defines a short transition between the first bore section and the second bore section. For example, the step forms an edge between the first bore section and the second bore section.

The first bore section and the second bore section comprise a common bore axis. The step of the transition section has a step surface extending within a plane having a normal, wherein the step surface is formed such that an angle between the normal and the common bore axis is approximately ±15 degree. Specifically, the step surface is formed such that the normal is approximately or exactly parallel with the common bore axis. Hence, by providing the transition section between the first bore section and the second bore section a short (with respect to a distance along the drilling axis), step-like transition and an edge between the first bore hole section and the second bore hole section may be formed.

According to a further exemplary embodiment, the transition section has a conical shape so that the first diameter merges into the second diameter in a conical manner.

In the mentioned example, the transition section has an inclined and sloping surface extending within a plane having a normal, wherein the step surface is formed such that an angle between the normal and the common bore axis is approximately 30 to 60 degree, specifically 45 degree.

According to a further exemplary embodiment the at least one electrically insulating (layer) structure comprises at least one of the group consisting of resin, in particular Bismaleimide-Triazine resin, cyanate ester, glass, in particular glass fibers, prepreg material, polyimide, liquid crystal polymer, epoxy-based Build-Up Film, FR4 material, a ceramic, and a metal oxide. Although prepreg or FR4 are usually preferred, other materials may be used as well.

In an embodiment, the at least one electrically conductive (layer) structure comprises at least one of the group consisting of copper, aluminum, and nickel. Although copper is usually preferred, other materials are possible as well.

In an embodiment, the component carrier is shaped as a plate. This contributes to the compact design of an electronic device, wherein the component carrier nevertheless provides a large basis for mounting electronic components thereon. Furthermore, in particular a naked die as preferred example for an embedded electronic component, can be conveniently embedded, thanks to its small thickness, into a thin plate such as a printed circuit board.

In an embodiment, the component carrier is configured as one of the group consisting of a printed circuit board, and a substrate.

In the context of the present application, the term "printed circuit board" (PCB) may particularly denote a plate-shaped component carrier which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more electronic components which may be embedded in a printed circuit board, a printed circuit board is usually configured for accommodating one or more electronic components on one or both opposing surfaces of the plate-shaped printed circuit board. They may be connected to the respective main surface by soldering.

In the context of the present application, the term "substrate" may particularly denote a small component carrier having substantially the same size as an electronic component to be mounted thereon.

In an embodiment, the component carrier is a laminate-type component carrier. In such an embodiment, the component carrier is a compound of multiple layer structures which are stacked and connected together by applying a pressing force, if desired accompanied by heat.

According to a further exemplary embodiment an electronic device comprising an electronic component with electric terminals and an above described component carrier in which the electronic component is packaged.

In an embodiment, the electronic component is selected from a group consisting of an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, a sensor, an actuator, a microelectromechanical system, a microprocessor, a capacitor, a resistor, an inductance, a battery, a switch, a camera, an antenna, and a logic chip. For example, a magnetic element can be used as an electronic component. Such a magnetic element may be a permanent magnetic element (such as a ferromagnetic element, an antiferromagnetic element or a ferrimagnetic element, for instance a ferrite core) or may be a paramagnetic element. However, other electronic components, in particular those who generate and emit electromagnetic radiation and/or are sensitive with regard to electromagnetic radiation propagating to the electronic component from an environment, may be embedded in the electronic device.

According to a further aspect of the present invention, a method of manufacturing a component carrier is described. According to the method, a layer stack of an electrically insulating structure and an electrically conductive structure is formed. A bore extending into the layer stack is bored, wherein the bore has a first bore section with a first diameter and a connected second bore section with a second diameter differing from the first diameter. Substantially the entire bore is filled with a thermally conductive material. The bore is in particular formed by mechanical drilling.

The aspects defined above and further aspects of the invention are apparent from the examples of embodiment to be described hereinafter and are explained with reference to these examples of embodiment.

BRIEF DESCRIPTION OF THE DRAWING

FIG. 1 shows a cross-sectional plan view of an embodiment of a component carrier having two bores according to the present invention and a further bore having a uniform diameter.

DETAILED DESCRIPTION OF ILLUSTRATED EMBODIMENTS

The invention will be described in more detail hereinafter with reference to examples of embodiment but to which the invention is not limited.

The illustrations in the drawings are schematical. In different drawings, similar or identical elements are provided with the same reference signs.

FIG. 1 illustrates a component carrier 100 into which an electrical component can be embedded or mounted thereon. The component carrier 100 comprises a layer stack 101 formed of an electrically insulating structure and an electrically conductive structure and a bore 110, 110' extending into the layer stack 101 and having a first bore section 111, 111' with a first diameter D1, D1' and a connected second bore section 112, 112' with a second diameter D2, D2' differing from the first diameter D1, D1'. The component carrier further comprises a thermally conductive material 102 filling substantially the entire bore 110, 110'. The bore 110, 110' is in particular formed by mechanical drilling. In the exemplary embodiment shown in FIG. 1, the first bore hole diameter D1, D1' is larger than the second bore hole diameter D2, D2'.

The bore 110, 110' is filled with the thermally conductive material 102. Besides the proper thermal conduction properties, the thermally conductive material 102 may also be electrically conducting. In an exemplary embodiment, the thermally conductive material 102 is copper or a copper compound.

For example, a multiple-diameter mechanical drilling (e.g. by a drill bit having two different diameter sections to form the bore in a counter bore or counter sink shape) may be used to replace the standard single diameter drill bit or stacked laser.

The bore 110, 110' filled with the thermally conductive material 102 may form a via connection between two or more layers within the layer stack 101 of the component carrier 100. By providing the bore 110, 110' with different diameters D1, D1', D2, D2' a small diameter target pad size of a pad section 105, 105' made of the thermally conductive material 102 and formed at an exit section of the bore 110, 110' and additionally a better heat transfer by the thermally conductive material 102 within the larger second bore section 111, 111' of the bore 110, 110' is achieved.

The layer stack 101 comprises a first surface 103 and a second surface 104 opposing the first surface 103, wherein the bore 110, 110' extends between the first surface 103 and the second surface 104. The first bore section 111, 111' extends from the first surface 103 into the layer stack 101 and the second bore section 112, 112' extends from the second surface 104 into the layer stack 101.

The thermally conductive material 102 forms a pad section 105, 105' onto the second surface 104. The pad section 105, 105' may be connected e.g. to a printed circuit board track. Furthermore, the pad section 105, 105' is part of the thermally conductive material 102 which fills the bore 110, 110' so that a via (vertical connection) through the layer stack 101 is formed. The via connects other embedded components and electrically layer structures within the layer stack 101 to the pad section 105, 105'. Typically, the pad section 105, 105' has a larger diameter than the printed circuit board track. However, it is possible to form the printed circuit board track and to fill the bore 110, 110' with the thermally conductive material 102 in one operating step. Hence, the pad section 105, 105' size may be reduced and has the same size (width) as the printed circuit board track.

The thermally conductive material 102 extends along the first surface 103 for forming a heat radiation section 106. The larger the heat radiation section 106 along the first surface 103, the larger the heat that may be transported away from the component carrier 100. The heat radiation section 106 forms a first covering area onto the first surface 103 and the pad section 105, 105' forms a second covering area onto the second surface 104. The first covering area is larger than the second covering area.

Regarding the size of the heat radiation section 106, the surface area of the heat radiation section 105, 105' which is defined between a circumference of the heat radiation section 105, 105' and an edge of the first bore section 111, 111' at the first surface 103 is limited in size, because if the overhang exceeds a certain threshold size, the risk of voids, cracks and other plating defects during a plating proceeding, where the thermally conductive material 102 flows into the bores 110, 110', increases.

The threshold size may be given in an aspect ratio AR which is defined by the thickness (length) A (according to FIG. 1 the length L1, L1' of the first bore section 111, 111' and the length L2, L2' of the second bore section 112, 112') of a bore 110, 110' with respect to an opening diameter R (according to FIG. 1 the diameter D1, D1' of the first bore section 111, 111' and the diameter D2, D2' of the second bore section 112, 112' of the second bore section 112, 112') of the bore at a respective surface of the component carrier:

$$AR = A/R$$

As can be taken from FIG. 1, the first bore section 111, 111' has a larger diameter D1, D1 than the second bore section 112, 112' and the opening diameter R (i.e. D1, D1') of the first bore section 111, 111' is increased in order to provide a large overhang of the heat radiation section 106. However, the diameter R (i.e. D2, D2') of the second bore section 112, 112' is reduced in order to provide a small sized pad section 105, 105' along the second surface 104.

For example, in a conventional bore 120 having a uniform diameter, a 101 of a component carrier 100 has a thickness A of 1 mm with 0.1 mm opening diameter R (also called mechanical drilled PTH (plated through hole) will have an aspect ratio AR=A/R of 10:1=10.

For example, the second bore section 112, 112' may have length L2, L2' of A=⅓ of the overall thickness (e.g. 1 mm) of the 101 and an opening diameter R (i.e. second diameter D2, D2') of R=0.1 mm. The first bore section 111, 111' may have ⅔ of the overall thickness (e.g. 1 mm) of the 101 drilled with a diameter R (i.e. first diameter D1, D1') of R=0.2 mm opening diameter. Hence, the total aspect ratio will be AR=3.33. The new aspect ratio lowers the risk for inclusion and other reliability defects during plating as the difficulty of the solution exchange inside the PTH is reduced. At the same time, a smaller pad section 105, 105' by the second bore section 112 is formed.

In comparison to the further bore 120 which is the bore 120 located between the two bores 110, 110' of the present invention, the aspect ratio AR is 10 for a diameter R=0,1 and the overall thickness A of 1 mm of the 101.

Summarizing, by the differently sized bore sections 111, 111', 112, 112', a high aspect ratio AR limitation for the copper filling process is reduced and a tight/small target pad annular ring breakout is prevented. Furthermore, the total volume of copper (functioning as the thermally conductive material) in the filled via (bores 110, 110') for better heat transfer is increased. Hence, less heat remains in the via (i.e. the bores 110, 110') which causes lower temperature and less expansion of the layer stack 101.

The thermally conductive material 102 extends along the first surface 103 between the bore 110, 110' and the further bore 120. Hence, along the first surface 103, a common heat radiation section 106 for the bore 110, 110' and the further bore 120 is generated.

Between the first bore section 111, 111' and the second bore section 112, 112' a transition section 113, 113' is formed. In the transition section 113, 113' the first diameter D1, D1' merges into the second diameter D2, D2'.

In the bore 110 shown at the left side in FIG. 1 (bore design I), the transition section 113 has a step-like shape 114 with a flat design (so that the first diameter D1 merges into the second diameter D2 in a stepwise and abrupt manner). The step defines a short transition between the first bore section D1, D1' and the second bore section D2. For example, the step forms an edge between the first bore section 111 and the second bore section 112.

The first bore section 111 and the second bore section 112 comprise a common bore axis 107. The step of the transition section 113 has a step surface extending within a plane having a normal, wherein the step surface is formed such that an angle between the normal and the common bore axis 107 is approximately ±15 degree. Specifically, the step surface is formed such that the normal is approximately or exactly parallel with the common bore axis 107.

In the bore 110' shown at the right side in FIG. 1 (bore design II), the transition section 113' has a conical shape 115 (i.e. with a slope design) so that the first diameter D1' merges into the second diameter D2' in a conical manner.

In the mentioned example, the transition section 113' has an inclined and sloping surface extending within a plane having a normal, wherein the step surface is formed such that an angle between the normal and the common bore axis 107' is approximately 30 to 60 degree, specifically 45 degree.

It should be noted that the term "comprising" does not exclude other elements or steps and the "a" or "an" does not exclude a plurality. Also elements described in association with different embodiments may be combined. It should also be noted that reference signs in the claims shall not be construed as limiting the scope of the claims. Implementation of the invention is not limited to the preferred embodiments shown in the figures and described above. Instead, a multiplicity of variants are possible which use the solutions shown and the principle according to the invention even in the case of fundamentally different embodiments.

REFERENCE SIGNS 100 component carrier
101 layer stack
102 thermally conductive material
103 first surface
104 second surface
105, 105' pad section
106 heat radiation section
107, 107' common bore axis
110, 110' bore
111, 111' first bore section
112, 112' second bore section
113, 113' transition section
114 step-like shape
115 conical shape
120 further bore
D1, D1' first diameter
D2, D2' second diameter
L1, L1' first length
L2, L2' second length
I first bore design
II second bore design

The invention claimed is:

1. A component carrier, comprising:
a layer stack formed of an electrically insulating structure and an electrically conductive structure;
a bore extending into the layer stack and having a first bore section with a first diameter and a connected second bore section with a second diameter differing from the first diameter; and
a thermally conductive material filling substantially the entire bore,
wherein, along the bore extending into the layer stack, the first diameter of the first bore section is constant and the second diameter of the second bore section is constant,
wherein the second diameter is smaller than the first diameter,
wherein a transition section between the first bore section and the second bore section has a conical shape so that the first diameter merges into the second diameter in a conical manner.

2. The component carrier according to claim 1,
wherein the first bore section extends from the first surface into the layer stack and the second bore section extends from the second surface into the layer stack.

3. The component carrier according to claim 1, further comprising:
a further bore extending into the layer stack,
wherein the further bore is spaced apart from the bore,
wherein the further bore extends between the first surface and the second surface,
wherein the thermally conductive material is filling substantially the entire further bore.

4. The component carrier according to claim 3,
wherein the thermally conductive material extends along the first surface between the bore and the further bore.

5. The component carrier according to claim 1,
wherein the bore is formed by mechanical drilling such that the shape of the transition section is formable.

6. The component carrier according to claim 1,
wherein the at least one electrically insulating structure comprises at least one of the group consisting of resin, cyanate ester, glass, prepreg material, polyimide, liquid crystal polymer, epoxy-based Build-Up Film, FR4 material, a ceramic, and a metal oxide.

7. The component carrier according to claim 1,
wherein the at least one electrically conductive structure comprises at least one of the group consisting of copper, aluminum, and nickel.

8. The component carrier according to claim 1,
wherein the component carrier is shaped as a plate.

9. The component carrier according to claim 1,
wherein the component carrier is a laminate-type component carrier.

10. An electronic device, the electronic device comprising:
an electronic component with electric terminals,
a component carrier in which the electronic component is packaged, the component carrier having a layer stack formed of an electrically insulating structure and an electrically conductive structure; and
a bore extending into the layer stack, the bore filled with a thermally conductive material and having a first bore section with a constant first diameter, a transition section, and a connected second bore section with a constant second diameter differing from the constant first diameter, the transition section having a conical shape such that the first bore section merges into the second bore section,
wherein the second diameter is smaller than the first diameter, wherein the layer stack comprises a first surface and a second surface opposing the first surface,
wherein the bore extends between the first surface and the second surface,
wherein the thermally conductive material forms a pad section onto the second surface,
wherein the thermally conductive material extends along the first surface for forming a heat radiation section,
wherein the heat radiation section forms a first covering area onto the first surface and the pad forms a second covering area onto the second surface,
wherein the first covering area is larger than the second covering area.

11. The electronic device according to claim 10,
wherein the electronic component is selected from a group consisting of an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, a sensor, an actuator, a microelectromechanical system, a microprocessor, a capacitor, a resistor, an inductance, a battery, a switch, a camera, an antenna, a magnetic element, and a logic chip.

12. A method of manufacturing a component carrier, the method comprising:
  forming a layer stack of an electrically insulating structure and an electrically conductive structure;
  mechanically drilling a bore extending into the layer stack, wherein the bore has a first bore section with a first diameter, a transition section, and a connected second bore section with a second diameter differing from the first diameter, the transition section having a conical shape such that the first bore section merges into the second bore section; and
  introducing a thermally conductive material into the bore,
wherein the layer stack comprises a first surface and a second surface opposing the first surface,
wherein the bore extends between the first surface and the second surface,
wherein the thermally conductive material forms a pad section onto the second surface,
wherein the thermally conductive material extends along the first surface for forming a heat radiation section,
wherein the heat radiation section forms a first covering area onto the first surface and the pad forms a second covering area onto the second surface,
wherein the first covering area is larger than the second covering area.

\* \* \* \* \*